(12) United States Patent
Yoo et al.

(10) Patent No.: US 10,998,353 B2
(45) Date of Patent: May 4, 2021

(54) ARRAY SUBSTRATE AND DISPLAY DEVICE

(71) Applicant: BOE Technology Group Co., Ltd., Beijing (CN)

(72) Inventors: Seongyeol Yoo, Beijing (CN); Seungjin Choi, Beijing (CN); Heecheol Kim, Beijing (CN); Youngsuk Song, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 41 days.

(21) Appl. No.: 16/160,223

(22) Filed: Oct. 15, 2018

(65) Prior Publication Data

US 2019/0051679 A1    Feb. 14, 2019

Related U.S. Application Data

(62) Division of application No. 14/421,947, filed as application No. PCT/CN2014/075809 on Apr. 21, 2014, now Pat. No. 10,134,786.

(30) Foreign Application Priority Data

Dec. 26, 2013 (CN) .......................... 201310739347.3

(51) Int. Cl.
*H01L 27/12* (2006.01)
*H01L 27/32* (2006.01)

(52) U.S. Cl.
CPC ........ *H01L 27/1288* (2013.01); *H01L 27/124* (2013.01); *H01L 27/127* (2013.01);
(Continued)

(58) Field of Classification Search
CPC ... H01L 29/04; H01L 27/127; H01L 27/3248; H01L 27/326; H01L 27/3265; H01L 27/1225; H01L 27/124; H01L 27/1288
See application file for complete search history.

(56) References Cited

U.S. PATENT DOCUMENTS

2002/0056838 A1* 5/2002 Ogawa .................. H01L 27/124
257/59
2004/0008300 A1* 1/2004 Maeda .............. G02F 1/133555
349/114
(Continued)

FOREIGN PATENT DOCUMENTS

CN    102456619 A    5/2012
CN    102629577 A    8/2012
(Continued)

OTHER PUBLICATIONS

International Search Report and Written Opinion dated Sep. 29, 2014 (PCT/CN2014/075809); ISA/CN.
(Continued)

*Primary Examiner* — Matthew E Warren
(74) *Attorney, Agent, or Firm* — Banner & Witcoff, Ltd.

(57) ABSTRACT

Disclosed is an array substrate and a display device. The array substrate includes: a plurality of gate lines and a plurality of data lines formed on a base substrate, and a plurality of pixel units defined by the plurality of gate lines and the plurality of data lines intersecting each other, wherein each pixel unit includes a thin film transistor and a pixel electrode connected with the thin film transistor, the pixel electrode, the data line, as well as an active layer, a source and a drain of the thin film transistor are disposed in a same layer and are formed through a single patterning process.

9 Claims, 6 Drawing Sheets

(52) U.S. Cl.
CPC ...... *H01L 27/1225* (2013.01); *H01L 27/3248* (2013.01); *H01L 27/3265* (2013.01)

(56) References Cited

U.S. PATENT DOCUMENTS

| | | | |
|---|---|---|---|
| 2004/0183978 A1* | 9/2004 | Jeoung | G02F 1/134363 349/141 |
| 2005/0077522 A1 | 4/2005 | Chang et al. | |
| 2005/0127359 A1* | 6/2005 | Son | G02F 1/134363 257/59 |
| 2007/0215945 A1* | 9/2007 | Tokunaga | H01L 29/7869 257/347 |
| 2012/0119232 A1 | 5/2012 | Song et al. | |
| 2012/0298985 A1* | 11/2012 | Chung | H01L 29/78693 257/43 |
| 2013/0001546 A1* | 1/2013 | Kamada | G02F 1/1368 257/43 |
| 2014/0077160 A1* | 3/2014 | Dai | H01L 27/3262 257/29 |
| 2014/0183519 A1 | 7/2014 | Ning et al. | |
| 2015/0221674 A1* | 8/2015 | Cheng | H01L 27/1248 257/43 |

FOREIGN PATENT DOCUMENTS

| | | | |
|---|---|---|---|
| CN | 102709237 A | | 10/2012 |
| CN | 102903675 A | * | 1/2013 |
| CN | 102903675 A | | 1/2013 |
| CN | 103295962 A | | 9/2013 |
| CN | 103700628 A | | 4/2014 |

OTHER PUBLICATIONS

Sep. 30, 2015—(CN)—First Office Action Appn 201310739347.3 with English Tran.
Jun. 28, 2016—(WO) IPRP—App. No. PCT/CN14/075809.

* cited by examiner

ARRAY SUBSTRATE AND DISPLAY DEVICE

This application is a divisional of U.S. patent application Ser. No. 14/421,947 filed Feb. 16, 2015, which is a U.S. National Phase Entry of International Application No. PCT/CN2014/075809 filed on Apr. 21, 2014, designating the United States of America and claiming priority to Chinese Patent Application No. 201310739347.3 filed on Dec. 26, 2013. The present application claims priority to and the benefit of the above-identified applications and the above-identified applications are incorporated by reference herein in their entirety.

TECHNICAL FIELD

The present disclosure relates to display field, particularly to an array substrate, a method of manufacturing array substrate, and a display device thereof.

BACKGROUND

A known method of manufacturing an array substrate used in a multi-dimensional electric field display panel is accomplished by six or seven patterning processes. While each patterning process comprises forming a material to be etched, photoresist coating, exposing, developing, etching, and removing the photoresist. For example, a method of manufacturing an array substrates typically comprises:
forming a pattern comprising a common electrode, a common electrode line, a gate and gate lines through the first patterning process;
forming an active layer through the second patterning process;
forming vias through the third patterning process;
forming a pattern comprising a source and a drain through the fourth patterning process;
forming an insulating layer through the fifth patterning process;
forming a pattern comprising a pixel electrode through the sixth patterning process.

As can be seen, the above method of manufacturing an array substrate suffers disadvantages such as complicated manufacturing process, low production efficiency, high costs and low economic benefits.

SUMMARY

An object of the present invention is to provide a method of manufacturing an array substrate which has simple manufacturing process, high production efficiency, low cost and good economic benefit, and an array substrate manufactured by the method, and a display device comprising the array substrate.

According to a first aspect of the present invention, there is provided a method of manufacturing an array substrate, the method comprises: forming a pattern comprising an active layer, a source, a drain, a data line and a pixel electrode on a base substrate through a single patterning process; forming a pattern of an insulating layer; and forming a pattern comprising a gate and a gate line through a single patterning process.

In one example, the step of forming a pattern comprising an active layer, a source, a drain, a data line and a pixel electrode on a base substrate through a single patterning process comprises:
forming a semiconductor film on the base substrate;
coating a photoresist on the semiconductor film, exposing the photoresist with a dual tone mask and developing to completely remain the photoresist corresponding to an active layer region, to partially remain the photoresist corresponding to regions of the source, the drain, the data line and the pixel electrode, and to completely remove the photoresist in remaining regions so as to expose the semiconductor film;
etching the exposed semiconductor film;
ashing the photoresist to thin the photoresist corresponding to the active layer region and to expose the semiconductor film in regions other than the active layer region;
transforming the exposed semiconductor film into conductor by plasma processing to form the pattern comprising the active layer, the source, the drain, the data line and the pixel electrode; and
removing residual photoresist.

In one example, the step of forming a pattern comprising a gate and a gate line through a single patterning process further comprises: forming a pattern comprising a common electrode line and a comb-shaped common electrode.

In one example, the step of forming a pattern comprising a gate and a gate line and a pattern comprising a comb-shaped common electrode and a common electrode line through a single patterning process comprises:
forming a transparent conductive film and a metal film in this order over the insulating layer;
coating a photoresist on the metal film, exposing the photoresist with a dual tone mask and developing to completely remain the photoresist corresponding to regions of the gate, the gate line and the common electrode line, to partially remain the photoresist corresponding to a comb-shaped common electrode region, and completely remove the photoresist in remaining regions so as to expose the metal film;
etching the exposed metal film and the transparent conductive film underlying the exposed metal film;
ashing the photoresist to thin the photoresist corresponding to the regions of the gate, the gate line and the common electrode line and expose the metal film in regions other than the regions of the gate, the gate line and the common electrode line;
etching the exposed metal film;
removing residual photoresist to form the pattern comprising the gate, the gate line, the common electrode line and the comb-shaped common electrode.

In one example, the pixel electrode is of comb-shaped.

In one example, a material for the semiconductor film comprises at least one of indium gallium zinc oxide, indium gallium tin oxide, or indium tin oxide.

According to a second aspect of the present invention, there is provided an array substrate comprising: a plurality of gate lines and a plurality of data lines formed on a base substrate, and a plurality of pixel units defined by the plurality of gate lines and the plurality of data lines intersecting each other; wherein each pixel unit comprises a thin film transistor and a pixel electrode connected with the thin film transistor, the pixel electrode, the data line, as well as an active layer, a source and a drain of the thin film transistor are disposed in the same layer.

In one example, the array substrate further comprises: an insulating layer overlaying the pixel electrode, the data line, the active layer, the source, and the drain; and a gate disposed on the insulating layer.

In one example, the array substrate further comprises a common electrode line and a comb-shaped common electrode connected with the common electrode line, both the common electrode line and the comb-shaped common electrode being disposed over the insulating layer.

In one example, the gate, the gate line and the common electrode line are disposed over the common electrode.

In one example, the pixel electrode is of comb-shaped.

In one example, a material for the pixel electrode, the data line, as well as the active layer, the source and the drain of the thin film transistors comprises at least one of indium gallium zinc oxide, indium gallium tin oxide, or indium tin oxide.

According to a third aspect of the present invention, there is provided a display device comprising the above-mentioned array substrate.

BRIEF DESCRIPTION OF THE DRAWINGS

In order to explain the technical solution of embodiments of the present invention more clearly, accompanying drawings of the embodiments will be introduced briefly below. Obviously, the accompanying drawings in the following description only relate to some embodiments of the present invention rather than limiting the present invention.

FIGS. 4a, 5a, 6a, 7a, 8a, 9a, 10a, 11a, 12a, 13a, 14a, 15a, and 16a are sectional views taken along A-A corresponding to FIGS. 4b, 5b, 6b, 7b, 8b, 9b, 10b, 11b, 12b, 13b, 14b, 15b, and 16b;

DETAILED DESCRIPTION

In order to make objects, technical details and advantages of the embodiments of the invention apparent, the technical solutions of the embodiments will be described in a clearly and fully understandable way in connection with the drawings related to the embodiments of the invention. Apparently, the described embodiments are just a part but not all of the embodiments of the invention. Based on the described embodiments herein, those skilled in the art can obtain other embodiment(s), without any inventive work, which should be within the scope of the invention.

Figure 1:
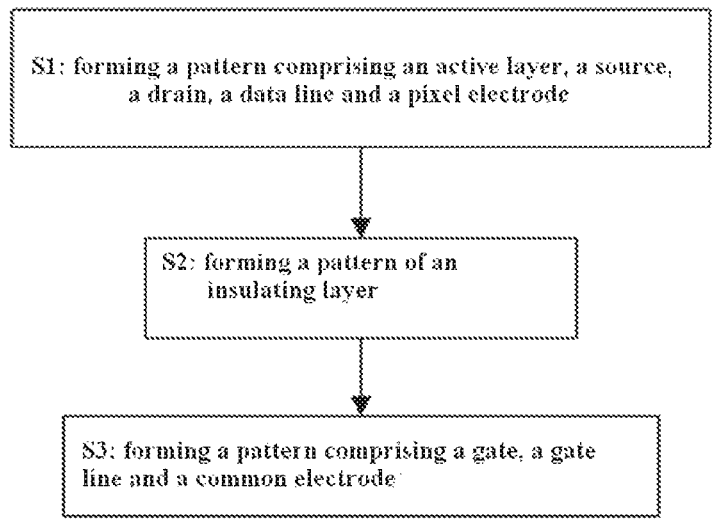
FIG. 1 is a flow chart illustrating a manufacturing method of an array substrate according to an embodiment of the present invention.

An embodiment of the present invention provides a method of manufacturing an array substrate as illustrated in FIG. 1, which comprises:

Step S1: forming a pattern comprising an active layer, a source, a drain, a data line and a pixel electrode on a base substrate through a single patterning process;

Step S2: forming a pattern of an insulating layer;

Step S3: forming a pattern comprising a gate and a gate line through a single patterning process.

In step S2, the pattern of the insulating layer is formed by depositing the insulating layer over the pattern obtained in step S1. The deposition may be any of known deposition methods, for example, a vapor deposition process is used in the present embodiment.

In the present embodiment, the array substrate may be of top gate thin film transistor, therefore, the pattern comprising the gate and the gate line are formed in the final step S3. For example, Step S3 comprises forming the gate and the gate line through a single patterning process with a mask. The patterning process comprises depositing a material to be etched, photoresist coating, exposing, developing, etching, and peeling off the photoresist.

In the manufacturing method of an array substrate described in the present embodiment, the patterning process is used only in step S1 and step S3 respectively. Compared to the known method which uses six or seven patterning processes, there are less, simple, and quick steps, thereby considerably increasing the production efficiency, reducing production costs and enhancing economic benefits.

Figure 2:
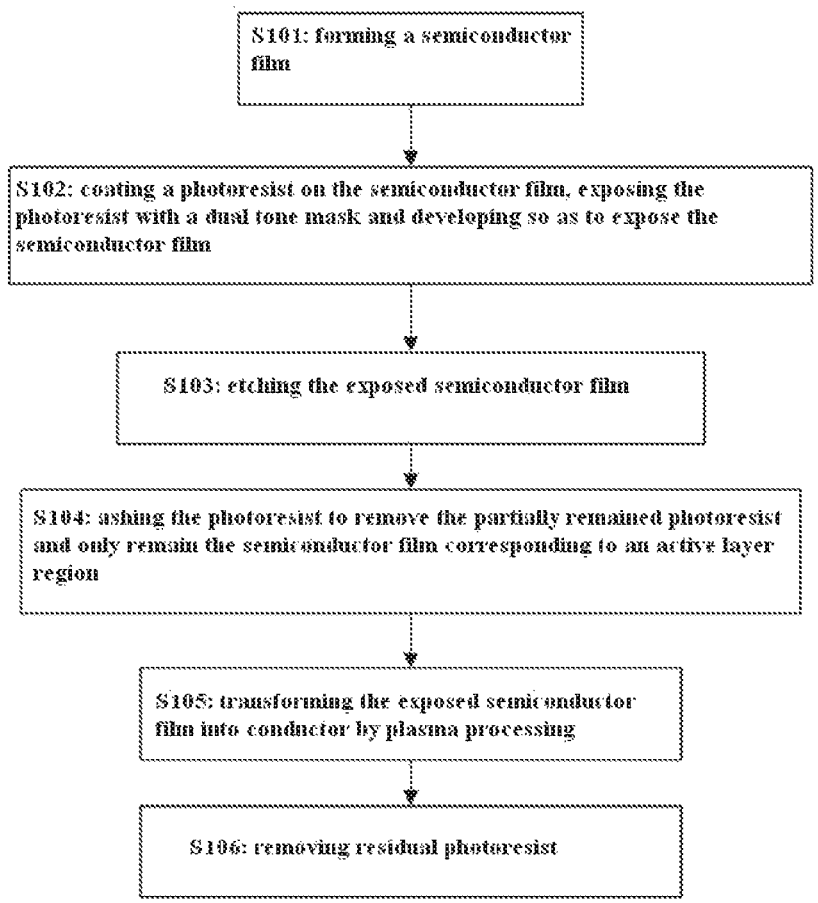
FIG. 2 is a flow chart of forming a pattern comprising an active layer, a source, a drain, a data line and a pixel electrode according to an embodiment of the present invention.
Figure 4A:
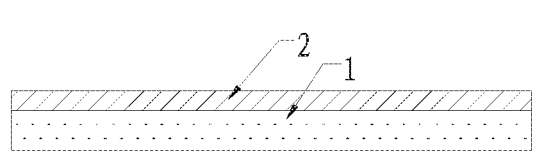
FIGS. 4a, 5a, 6a, 7a, 8a, 9a, 10a, 11a, 12a, 13a, 14a, 15a, and 16a are cross sectional views of an array substrate manufactured by the method according to an embodiment of the present invention.
Figure 4B:
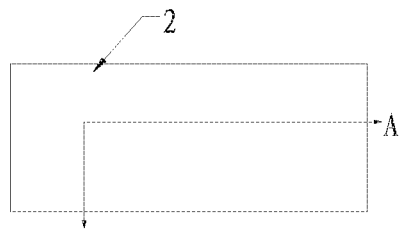
FIGS. 4b, 5b, 6b, 7b, 8b, 9b, 10b, 11b, 12b, 13b, 14b, 15b, and 16b are schematic plan view of an array substrate manufactured by the method according to an embodiment of the present invention, where

In one example, as illustrated in FIG. 2, the step S1 comprises:

S101: as illustrated in FIGS. 4a and 4b, forming a semiconductor film 2 on the base substrate 1. For example, the semiconductor film 2 is formed through various methods, including deposition, such as chemical vapor deposition (CVD), and sputtering, which is not limited herein.

Figure 5A:
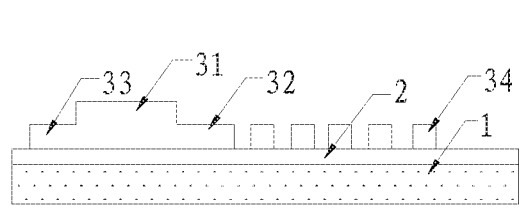
Figure 5B:
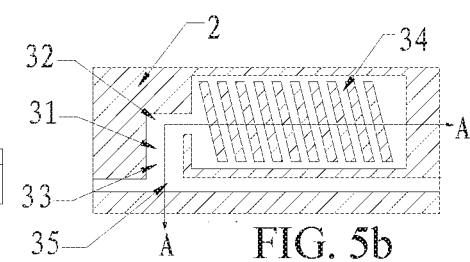

S102: as illustrated in FIGS. 5a and 5b, coating a photoresist on the semiconductor film 2, exposing the photoresist with a dual-tone mask and developing, such that the photoresist 31 corresponding to the active layer region is entirely remained, the photoresist 33, 32, 35, 34 corresponding to source, drain, data line and pixel electrode regions are partially remained and has a thickness less than that of the photoresist 31, and the photoresist corresponding to remaining regions is completed removed to expose the semiconductor film 2. The dual-tone mask may be a halftone mask, or may be a gray-tone mask.

Figure 6A:
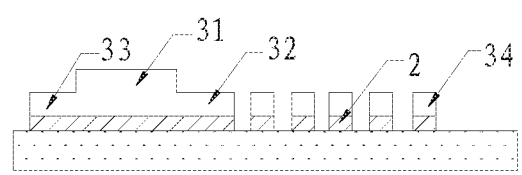
Figure 6B:
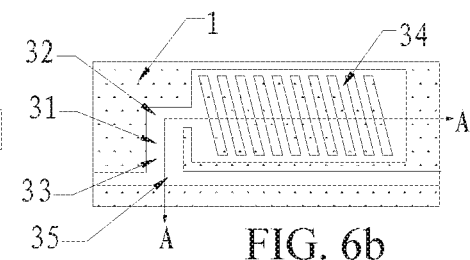

S103: as illustrated in FIGS. 6a and 6b, etching the exposed semiconductor film 2.

Figure 7A:
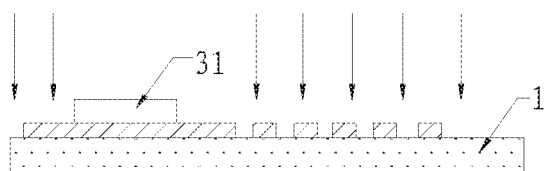
Figure 7B:
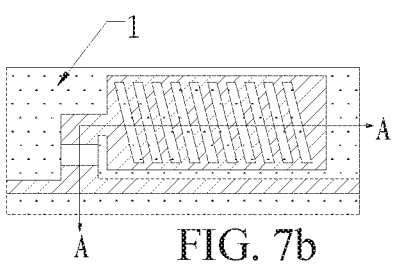

S104: as illustrated in FIGS. 7a and 7b, ashing the photoresist to remove a part of the partially-remained photoresist 32, 33, 34, 35 and to thin the photoresist 31 corresponding to the active layer region, such that the semiconductor film 2 in regions other than the active layer region is exposed.

Figure 8A:
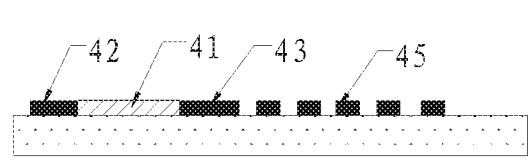
Figure 8B:
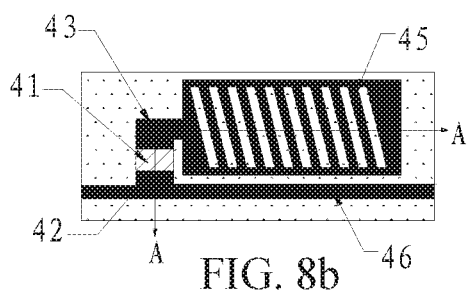

S105: as illustrated in FIGS. 8a and 8b, transforming the exposed semiconductor film 2 into a conductor through plasma processing to form a pattern comprising the source 42, the drain 43, the data line 46 and the pixel electrode 45. The plasma processing changes the nature of the exposed semiconductor film 2 such that the semiconductor becomes conductor. However, during the plasma processing, the nature of semiconductor film corresponding to the active layer region does not change due to the protection of the photoresist and is still semiconductor, hence, the semiconductor film corresponding to the active layer could be used as the active layer of thin film transistor.

S106: removing the residual photoresist 31 to expose the active layer 41. At this time, the active layer 41, the source 42, the drain 43, the data line 46 and the pixel electrode 45 included in the thin film transistor are all formed on the base substrate 1 and located in the same layer.

In the present embodiment, since the semiconductor film 2 becomes conductor by plasma processing, which is further used to form the source 42, the drain 43, the data line 46 and the pixel electrode 45, therefore only one patterning process is needed to form the source 42, the drain 43, the data line 46 and the pixel electrode 45. Whereas in known manufacturing process, these components needs to be formed through three to five patterning processes and each patterning process comprises at least forming the material to be etched, photoresist coating, exposing, developing and etching, and removing photoresist. Therefore, the manufacturing method of the array substrate according to the present embodiment considerably reduces complexity of manufacturing process and increases production efficiency.

The pixel electrode 45 may be a comb-shaped pixel electrode as illustrated in FIGS. 8a and 8b (or referred to as strip-shaped pixel electrode, or slit-shaped pixel electrode) or may be a plate-shaped pixel electrode.

Figure 9A:
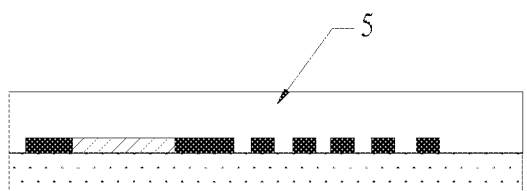
Figure 9B:
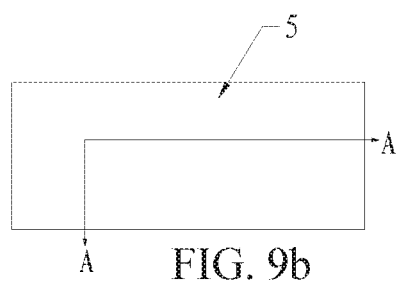

In one example, as illustrated in FIGS. 9a and 9b, the step S2 comprises: forming (by deposition, coating, or printing) an insulating layer 5 on the base substrate 1 which has the active layer 41, the source 42, the drain 43, the data line 46 and the pixel electrode 45 formed thereon. The insulating layer 5 may be formed of for example at least one of silicon nitride, silicon oxide or silicon oxynitride.

If the array substrate in the embodiment of the present invention is applied in TN (Twisted Nematic) type liquid crystal display panels, the pixel electrode 45 is preferably of plate-shaped. Moreover, because the common electrode is located on an opposed substrate (such as color filter substrate) disposed opposite to the array substrate, the formation of the common electrode and the common electrode line are not required in step S3, that is, only the gate and the gate line are formed in step S3. In one example, step S3 comprises: depositing a gate metal film on the base substrate 1 having the insulating layer 5 formed thereon, and then forming a pattern comprising a gate and a gate line through a patterning process, in which the gate and the gate line are formed integrally and the gate is formed over the active layer 41.

Figure 3:
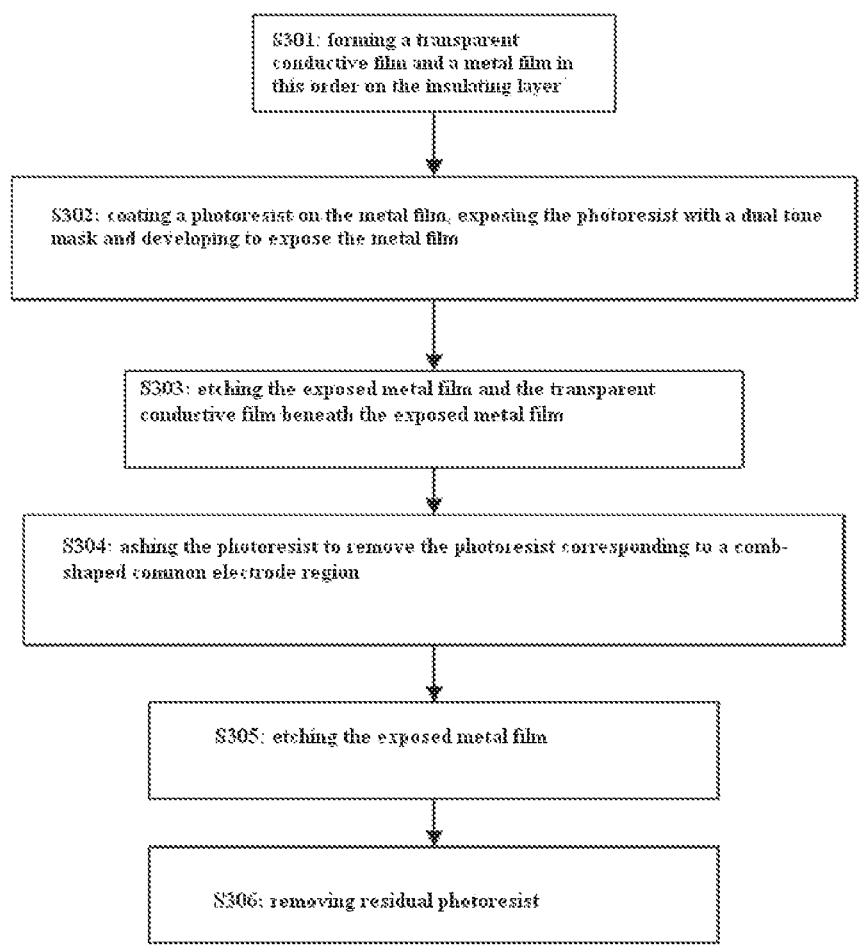
FIG. 3 is a flow chart of forming a pattern comprising a gate, a gate line, a common electrode and a common electrode line according to an embodiment of the present invention.
Figure 10A:
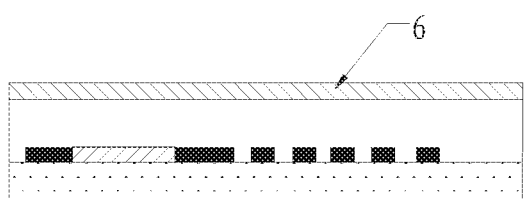
Figure 10B:
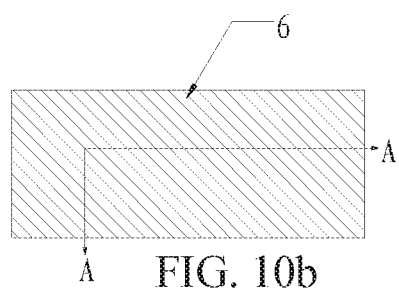
Figure 11A:
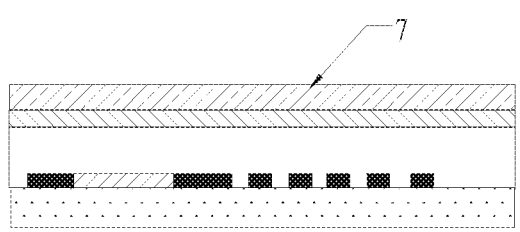
Figure 11B:
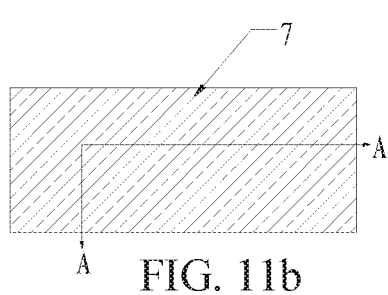

When the manufacturing method described in the present embodiment is used to manufacture a multi-dimensional electric field (for example ADS or IPS type) array substrate, it is further required to form a comb-shaped common electrode and a common electrode line connecting to the comb-shaped common electrode on the substrate. In one example, step S3 comprises: forming a pattern comprising a gate and a gate line as well as a pattern comprising a comb-shaped common electrode and a common electrode line through a single patterning process. As illustrated in FIG. 3, step S3 for example comprises:

S301: as illustrated in FIGS. 10a~10b, forming a transparent conductive film 6 on the insulating layer 5 (for example, by deposition, spin coating or printing), and as illustrated in FIGS. 11a~11b, forming a metal film 7 on the transparent conductive film 6 (for example, by deposition, spin coating or printing).

Figure 12A:
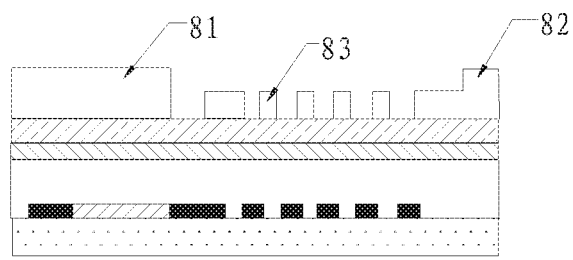
Figure 12B:
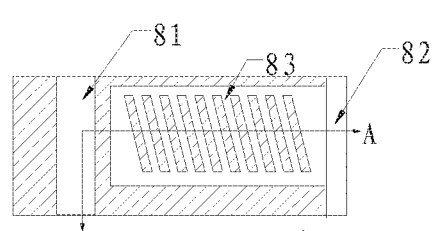

S302: as illustrated in FIGS. 12a~12b, coating a photoresist on the metal film 7, exposing the photoresist by a dual tone mask and developing it to completely remain the photoresists 81, 82 corresponding to the regions of gate, gate line and common electrode line, to partially remain the photoresist 83 corresponding to the comb-shaped common electrode region, where a thickness of photoresist 83 less than that of photoresists 81, 82, and to remove the photoresist in remaining regions to expose the metal film 7.

Figure 13A:
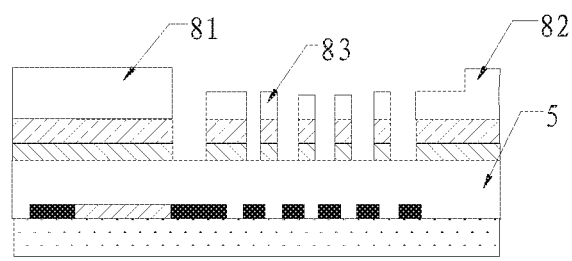
Figure 13B:
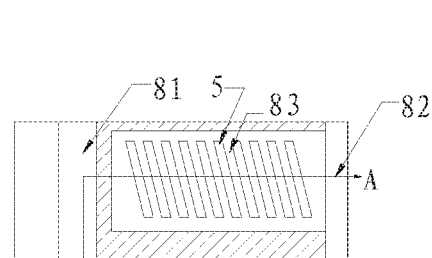

S303: as illustrated in FIGS. 13a~13b, etching the exposed metal film 7 and the transparent conductive film 6.

Figure 14A:
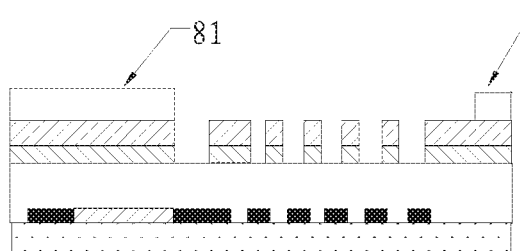
Figure 14B:
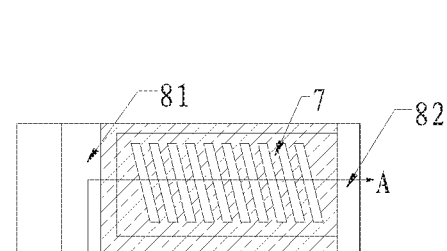

S304: as illustrated in FIGS. 14a~14b, performing an ashing process to remove the photoresist 83 corresponding to the comb-shaped common electrode region and to thin the photoresists 81 and 82 corresponding to regions of the gate, the gate line and the common electrode line, so as to expose the metal film 7 in regions other than regions of the gate, the gate line and the common electrode line.

Figure 15A:
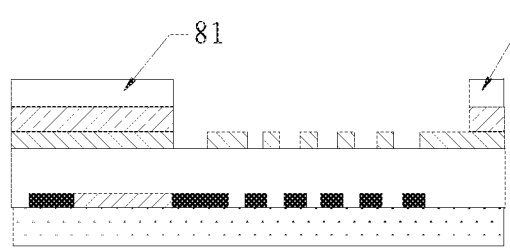
Figure 15B:
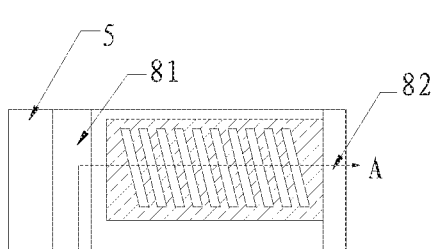
Figures 16A, 16B:
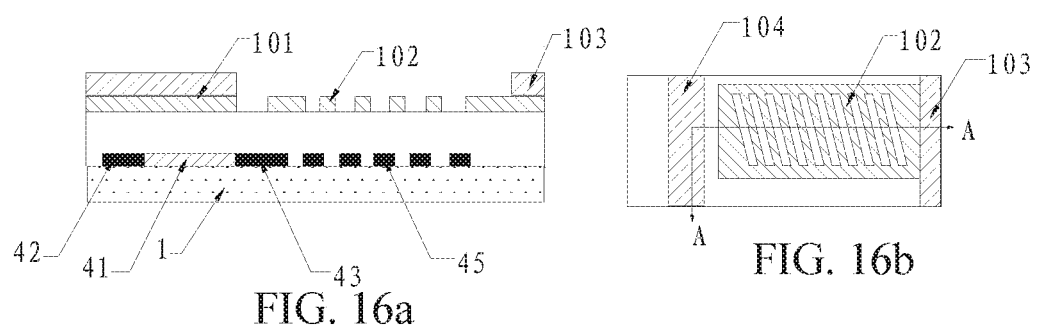

S305: as illustrated in FIGS. 15a~15b, etching the exposed metal film 7;

S306: as illustrated in FIGS. 16a~16b, removing the residual photoresist 81 and 82 to form a pattern comprising the gate 101, the gate line 104, the comb-shaped common electrode 102 and the common electrode line 103. In the present embodiment, the gate 101 is composed of a gate metal part of a gate line 104 that overlaps the active layer 41 and the transparent conductive film 6 beneath the gate metal part.

The metal film 7 may be a single-layer film formed of metal such as Cr, W, Ti, Ta, Mo, Al, Cu or a composite film composed of multilayer metal film. The transparent conductive film 6 may be of ITO (Indium Tin oxide) or IZO (Indium Zinc Oxide).

In the present embodiment, the gate 101, the gate line 104, and the common electrode line 103 may be considered as only formed of the metal film, thus, the gate 101, the gate line 104, and the common electrode line 103 are disposed over the comb-shaped common electrode 102. It is also possible to consider that the gate 101, the gate line 104, and the common electrode line 103 are all composed of two parts, i.e., a metal film and a transparent conductive film from top to bottom. In such a case, because the metal film and the transparent conductive film are both conductors, the electrical conductivity of the gate 101, the gate line 104, and the common electrode line 103 is kept; moreover, the light shielding effect is obtained by the non-transparency of the metal film.

In the present embodiment, the gate 101, the gate line 104, the common electrode 102, and the common electrode line 103 are formed through a single patterning process, which greatly reduces the complexity and costs of manufacturing process and increases the production efficiency.

The material for the semiconductor film 2 may be at least one of indium gallium zinc oxide, indium gallium tin oxide, and indium tin oxide. Indium gallium zinc oxide (IGZO) is preferred due to its high carrier mobility, which gives fast response to the thin film transistor formed of it and increases the speed of response of the array substrate.

In summary, in the manufacturing method of the array substrate described in the present embodiment, the manufacturing of the array substrate is completed by only two patterning processes, which is simple and quick and has high production efficiency, thereby reducing the number of masks, reducing the material consumption such as photoresist and developing solution, and hence reducing the manufacturing cost and increasing the production efficiency and economic benefit.

Figure 17:
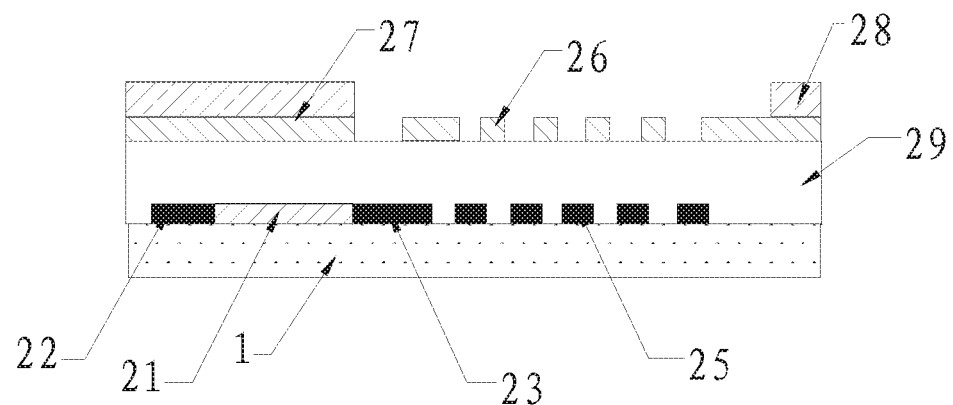
FIG. 17 is a cross sectional structure diagram of an array substrate according to an embodiment of the present invention.

Another embodiment of the present invention further provides an array substrate, which is manufactured by the method described above. As illustrated in FIG. 17, the array substrate may comprise: a plurality of gate lines and a plurality of data lines (not illustrated) formed on the base substrate 1, and a plurality of pixel units (not illustrated) defined by a plurality of gate lines and a plurality of data lines intersecting each other. Each of the pixel units comprises a thin film transistor (not illustrated) and a pixel electrode 25 connected with the thin film transistor, and the pixel electrode 25, the data lines, as well as the active layer 21, the source 22 and the drain 23 of the thin film transistor are disposed in the same layer. However, in a known array substrate, the active layer is typically disposed over the source 22 and the drain 23. As illustrated in FIG. 17, the pixel electrode 25 is disposed on the surface of the base substrate 1. In the array substrate of the present embodiment, since the active layer 21, the source 22, the drain 23, the data line and the pixel electrode 25 are disposed in the same layer, they can be formed through only one patterning process, which is simple and quick, thereby reducing the number of masks, reducing the material consumption such as photoresist and developing solution, and hence reducing the manufacturing cost and increasing the production efficiency and economic benefit.

In one example, the array substrate further comprises: an insulating layer 29 overlaying the pixel electrode 25, the active layer 21, the source 22, the drain 23 and the data line 2, and the gate 27 disposed on the insulating layer 29. The gate 27 and the gate line may be formed integrally, and the gate line is configured to transmit signals for turning on or off thin film transistor.

In the array substrate described in the present embodiment, the thin film transistor is of top gate. If the array substrate described in the present embodiment is applied in TN type liquid crystal display panels, the common electrode opposite to the pixel electrode 25 is disposed on an opposed substrate (such as color filter substrate) disposed opposite to the array substrate, none of the common electrode and the common electrode line is needed to be formed in the array substrate, that is, only the gate and the gate line are needed to be formed through an ordinary patterning process.

When the array substrate described in the present embodiment is used to manufacture a multi-dimensional electric field (for example ADS or IPS type) liquid crystal display panel, it is further required to form on the array substrate the common electrode and the common electrode line supplying the common electrode with voltage, and the common electrode is of comb-shaped. In such case, the array substrate described in the present embodiment may further comprise the common electrode line 28 disposed over the insulating layer 29 and the comb-shaped common electrode 26 connected with the common electrode lines 28. Furthermore, the gate 27, the gate line and the common electrode line 28 are disposed over the common electrode 26.

With the array substrate described in the present embodiment, the common electrode 26, the common electrode line 28, the gate 27 and the gate line are formed through only one patterning process, which has the advantages of simple manufacturing, low material consumption and apparatus cost, and good economic benefits.

In one example, as illustrated in FIG. 17, the pixel electrode 25 described in the present embodiment is a comb-shaped pixel electrode. In other examples, the pixel electrode 25 is a plate-shaped electrode disposed in a pixel region.

Materials for the pixel electrode 25, the data line, as well as the active layer 21, the source 22 and the drain 23 of the thin film transistor may comprise at least one of indium gallium zinc oxide, indium gallium tin oxide, or indium tin oxide. Preference is IGZO.

The active layer 21 is a semiconductor layer, but IGZO is a semiconductor per se, and the source 21, the drain 22, the data line and the pixel electrode 25 are all conductors. Therefore, in the manufacturing process, it is required to transform IGZO into conductor by plasma processing, so as to guarantee the quality of array substrate.

In summary, the array substrate described in the present embodiment has advantages of simple structure, low manufacturing cost and good economic benefit.

In the embodiments of the above-mentioned array substrate and manufacturing method thereof, top gate thin film transistors are described as an example, however they are not limited thereto. For an array substrate comprising bottom gate thin film transistors, it is only required to interchange the positions between the active layer 21, the source 22, the drain 23, the pixel electrode 25 and the data line which are formed in the same layer and layers over the insulating layer 29, that is, the active layer 21, the source 22, the drain 23, the pixel electrode 25 and the data line are all disposed over the insulating layer 29, whereas the gate 27, the gate line, the common electrode 26 and the common electrode line 28 are all disposed under the insulating layer 29. As for the manufacturing method, it is only required to adjust the order of the above-mentioned steps S1 and S3 to manufacture in the order of steps S3-S2-S1 with each step not changed in its manufacturing process.

Another embodiment of the present invention further provides a display device comprising the array substrate manufactured by the method described in embodiments of the present invention or comprising the array substrate described in embodiments of the present invention. The display device may be any product or components with display function such as an electronic paper, a liquid crystal display panel, an OLED panel, a cell phone, a tablet computer, a TV set, a display, a notebook computer, a digital frame, or a navigator.

In the array substrate and the manufacturing method thereof and the display device in the above-mentioned embodiments of the present invention, only two patterning processes are required to complete the manufacturing of the array substrate, in contrast to traditional manufacturing process, the invention has less and simple manufacturing steps, which greatly reduces the manufacturing complexity and the cost, thereby considerately increasing the production efficiency and economic benefit.

What is described above is related to the illustrative embodiments of the disclosure only and not limitative to the scope of the disclosure; the scopes of the disclosure are defined by the accompanying claims.

The invention claimed is:
1. An array substrate, comprising:
a plurality of gate lines and a plurality of data lines formed on a base substrate; and
a plurality of pixel units defined by the plurality of gate lines and the plurality of data lines intersecting each other, wherein each pixel unit comprises a thin film transistor and a pixel electrode connected with the thin film transistor, the pixel electrode, the data lines, as well as an active layer, a source and a drain of the thin film transistor are disposed in a same layer and are formed through a single patterning process,
wherein each of the source and the drain is non-overlapped with the active layer in a direction perpendicular to a plane of the base substrate, the pixel electrode and the drain are non-overlapped with each other in the direction perpendicular to the plane of the base substrate,
wherein the array substrate further comprises; an insulating layer overlaying the pixel electrode, a gate disposed on the insulating layer, a common electrode line, and a comb-shaped common electrode connected with the common electrode line, both the common electrode line and the comb-shaped common electrode are disposed over the insulating layer, and wherein the gate, the gate lines, and the common electrode line are disposed over the comb-shaped common electrode.

2. The array substrate of claim 1, wherein the insulating layer overlays data lines, the active layer, the source, and the drain.

3. The array substrate of claim 1, wherein the pixel electrode is comb-shaped.

4. The array substrate of claim 1, wherein a material for the pixel electrode, the data lines, as well as the active layer, the source and the drain of the thin film transistors comprises at least one of indium gallium zinc oxide, indium gallium tin oxide, or indium tin oxide.

5. A display device, comprising the array substrate of claim 1.

6. The display device of claim 5, wherein the insulating layer overlays the data lines, the active layer, the source, and the drain.

7. The display device of claim 5, wherein the pixel electrode is comb-shaped.

8. The display device of claim 5, wherein a material for the pixel electrode, the data lines, as well as the active layer, the source and the drain of the thin film transistors comprises at least one of indium gallium zinc oxide, indium gallium tin oxide, or indium tin oxide.

9. The array substrate of claim 1, wherein forming the pixel electrode, the data lines, as well as the active layer, the source and the drain of the thin film transistor through the single patterning process comprises:

forming a semiconductor film on the base substrate;

coating a photoresist on the semiconductor film, exposing the photoresist with a dual tone mask and developing to completely remain the photoresist corresponding to an active layer region, to partially remain the photoresist corresponding to regions of the source, the drain, the data lines, and the pixel electrode, and to completely remove the photoresist in remaining regions so as to expose the semiconductor film;

etching the exposed semiconductor film;

ashing the photoresist to thin the photoresist corresponding to the active layer region and to expose the semiconductor film in regions other than the active layer region;

transforming the exposed semiconductor film into a conductor by plasma processing to form a pattern comprising the active layer, the source, the drain, the data lines, and the pixel electrode; and removing residual photoresist.

* * * * *